United States Patent
Ikuta

(10) Patent No.: US 9,042,421 B2
(45) Date of Patent: May 26, 2015

(54) SURFACE EMITTING LASER, SURFACE EMITTING LASER ARRAY, AND OPTICAL APPARATUS HAVING SURFACE EMITTING LASER ARRAY

(75) Inventor: Mitsuhiro Ikuta, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 94 days.

(21) Appl. No.: 13/273,539

(22) Filed: Oct. 14, 2011

(65) Prior Publication Data

US 2012/0093188 A1   Apr. 19, 2012

(30) Foreign Application Priority Data

Oct. 18, 2010 (JP) .................................. 2010-233276

(51) Int. Cl.
| | | |
|---|---|---|
| H01S 5/00 | (2006.01) | |
| H01S 5/183 | (2006.01) | |
| B82Y 20/00 | (2011.01) | |
| H01S 5/343 | (2006.01) | |

(52) U.S. Cl.
CPC ............. *H01S 5/18391* (2013.01); *B82Y 20/00* (2013.01); *H01S 5/18311* (2013.01); *H01S 5/34326* (2013.01)

(58) Field of Classification Search
CPC   H01S 5/18311; H01S 5/18391; H01S 5/4081
USPC .............................. 372/50.124, 50.23, 24, 101
See application file for complete search history.

(56) References Cited

U.S. PATENT DOCUMENTS

| | | | | |
|---|---|---|---|---|
| 5,561,683 | A | * | 10/1996 | Kwon .............................. 372/96 |
| 6,590,917 | B2 | | 7/2003 | Nakayama et al. ......... 372/45.01 |
| 7,193,762 | B1 | | 3/2007 | Kimura ..................... 359/204.04 |
| 7,499,481 | B2 | | 3/2009 | Ikuta ......................... 372/50.124 |
| 7,697,586 | B2 | | 4/2010 | Ikuta ......................... 372/50.124 |
| 7,796,665 | B2 | | 9/2010 | Ikuta ......................... 372/50.124 |
| 7,796,667 | B2 | | 9/2010 | Ikuta ......................... 372/50.124 |
| 7,876,800 | B2 | | 1/2011 | Ikuta ......................... 372/50.124 |
| 7,888,149 | B2 | | 2/2011 | Ikuta .............................. 438/29 |
| 7,940,826 | B2 | | 5/2011 | Ikuta ......................... 372/46.014 |
| 7,991,035 | B2 | | 8/2011 | Ikuta ........................... 372/50.12 |

(Continued)

FOREIGN PATENT DOCUMENTS

| | | |
|---|---|---|
| JP | 2000-022271 | 1/2000 |
| JP | 2001-284722 | 10/2001 |

(Continued)

*Primary Examiner* — Tod T Van Roy
(74) *Attorney, Agent, or Firm* — Fitzpatrick, Cella, Harper & Scinto

(57) ABSTRACT

There is provided a surface emitting laser allowing a direction of a far-field pattern (FFP) centroid to be inclined from a normal direction of a substrate providing the surface emitting laser, comprising: a substrate; a lower reflecting mirror, an active layer, an upper reflecting mirror stacked on the substrate; and a surface relief structure located in an upper portion of a light emitting surface of the upper reflecting mirror, the surface relief structure being made of a material allowing at least some beams emitted from the surface emitting laser to be transmitted therethrough, a plurality of regions having a predetermined optical thickness in a normal direction of the substrate being formed in contact with other region in an in-plane direction of the substrate, and a distribution of the optical thickness in the in-plane direction of the substrate is asymmetric to a central axis of the light emitting regions.

13 Claims, 16 Drawing Sheets

(56) References Cited

U.S. PATENT DOCUMENTS

| | | | |
|---|---|---|---|
| 8,331,414 B2 | 12/2012 | Ikuta | 372/50.124 |
| 2009/0097522 A1* | 4/2009 | Justice et al. | 372/50.11 |
| 2009/0180506 A1* | 7/2009 | Maeda et al. | 372/44.01 |
| 2010/0303113 A1* | 12/2010 | Joseph | 372/36 |
| 2011/0293331 A1 | 12/2011 | Inao et al. | 399/220 |
| 2012/0093188 A1* | 4/2012 | Ikuta | 372/50.1 |

FOREIGN PATENT DOCUMENTS

| | | |
|---|---|---|
| JP | 2007-093770 | 4/2007 |
| JP | 2008-052197 | 3/2008 |

* cited by examiner

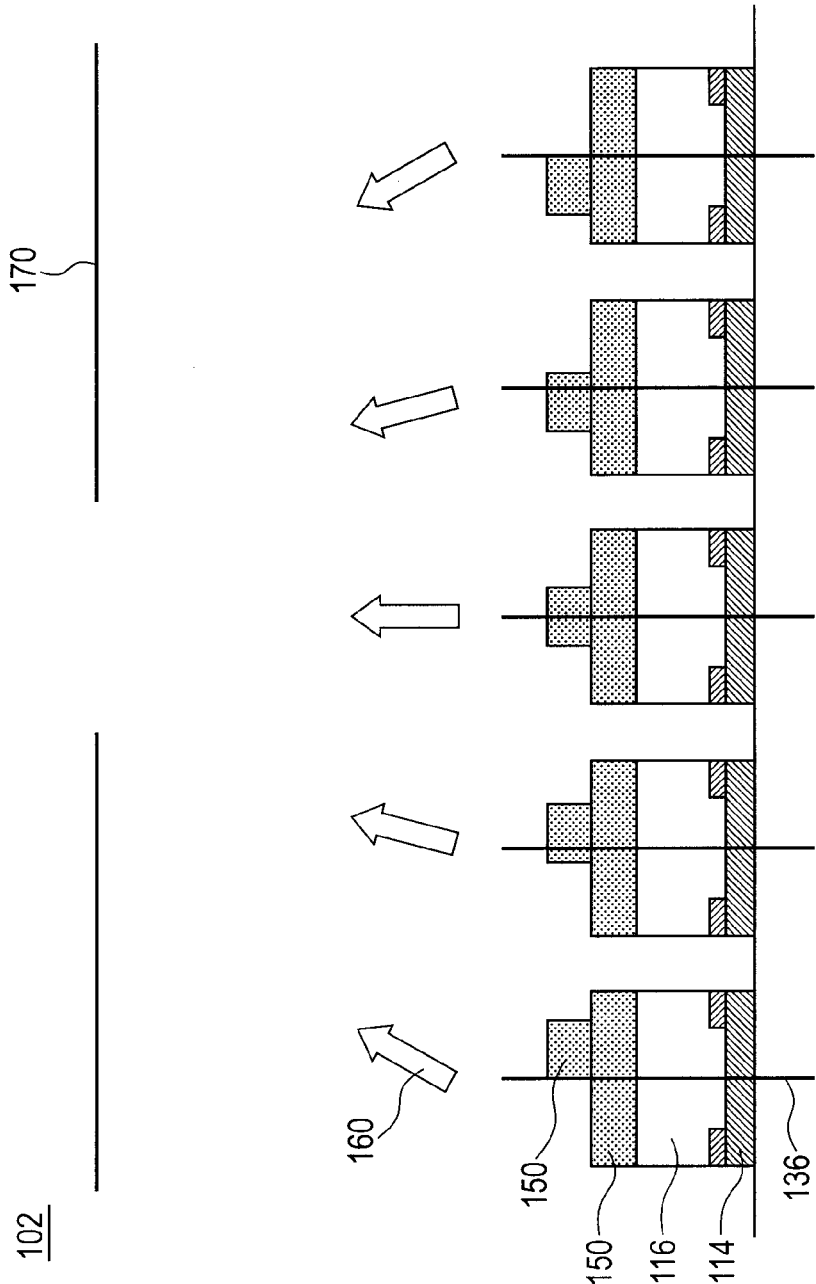

FFP

FAR-FIELD PHASE (λ)

SURFACE EMITTING LASER, SURFACE EMITTING LASER ARRAY, AND OPTICAL APPARATUS HAVING SURFACE EMITTING LASER ARRAY

BACKGROUND OF THE INVENTION

1. Field of the Invention

The present invention relates to a surface emitting laser, a surface emitting laser array, and an optical apparatus having the surface emitting laser array.

2. Description of the Related Art

A vertical-cavity surface-emitting laser (VCSEL), by which it is easy to form a two-dimensional array as an exposure light source for forming a latent image on a photoreceptor as a scanning surface, is used for a scanning optical apparatus in an electrophotographic image forming apparatus for use in a laser beam printer or a digital copier.

An example of an optical system of an image forming apparatus using a surface emitting laser is disclosed in Japanese Patent Application Laid-Open No. 2008-052197. According to Japanese Patent Application Laid-Open No. 2008-052197, a surface emitting laser having a plurality of light emitting points is used as a multi-beam laser light source. In order to limit the light beam width of a light beam emitted from the light source and to form the beam into a desired beam shape, the optical system has an aperture stop common to each laser light source. The formed beams are deflected and scanned by an optical deflector and imaged in a spot shape on a photoreceptor drum surface as a scanning surface by an imaging optical system.

SUMMARY OF THE INVENTION

The aforementioned conventional multi-beam laser light source has the following problem.

The distance between each laser device and the optical axis of an optical system is generally different from each other. Specifically, the principal ray as a light beam connecting the center of the aperture stop of the optical system to each laser device is different in direction for each laser device.

In a case in which the direction of a far-field pattern (FFP) centroid of each laser is a uniform direction, a problem occurs such that each beam emitted from each laser device and extracted by the aperture stop is different in intensity and shape depending on the positional relation between the optical axis of the optical system and each laser light source. Specifically, the direction of the FFP centroid of each laser light source is generally parallel to the normal line of the substrate of the each laser light source. Here, the direction of FFP centroid indicates a direction where a centroid of a beam profile in far-field is.

At this time, the amount of light emitted from an off-axis laser light source and passing through the aperture stop is smaller than the amount of light emitted from the axial laser light source. Consequently, the focusing spot intensity of light emitted from the off-axis light source is smaller than that from the axial light source on the scanning surface. As a result, intensity non-uniformity occurs in the spot. In addition, the ratio between a pupil end intensity and a pupil center intensity of the light beam emitted from the off-axis light source is smaller than that of the light beam emitted from the on-axial light source. Accordingly, the focusing spot diameter of light emitted from the off-axis light source is larger than that from the axial light source on the scanning surface. As a result, shape unevenness occurs in the spot.

As a result of the spot intensity non-uniformity and shape unevenness, image deterioration occurs.

In view of the above problem, it is an object of the present invention to provide a surface emitting laser array that allows a direction of a far-field pattern (FFP) centroid to be inclined from a normal direction of a substrate providing the surface emitting laser and that is capable of providing different FFP depending on a position of the surface emitting laser. Further, it is another object of the present invention to provide, in an optical system having a common aperture stop, an optical apparatus having the surface emitting laser array capable of suppressing intensity non-uniformity and shape unevenness in a focusing spot on a scanning surface.

A surface emitting laser of the present invention includes; a substrate; a lower reflecting mirror, an active layer, an upper reflecting mirror stacked on the substrate, and a surface relief structure located in an upper portion of a light emitting surface of the upper reflecting mirror, wherein the surface relief structure is made of a material allowing at least some beams emitted from the surface emitting laser to be transmitted therethrough, a plurality of regions having a predetermined optical thickness in a normal direction of the substrate is formed in contact with other region in an in-plane direction of the substrate, and a distribution of the optical thickness in the in-plane direction of the substrate is asymmetric to a central axis of a light emitting region of the surface emitting laser.

A surface emitting laser array of the present invention has a plurality of surface emitting lasers, the plurality of the surface emitting lasers being arranged in an array form, wherein some or all of the plurality of the surface emitting lasers include the aforementioned surface emitting lasers.

An optical apparatus of the present invention includes the aforementioned surface emitting laser array; and an optical system extracting a beam emitted from a surface emitting laser constituting the surface emitting laser array through a common aperture stop.

The present invention can provide a surface emitting laser array that allows a direction of a far-field pattern (FFP) centroid to be inclined from a normal direction of a substrate providing the surface emitting laser and that is capable of providing different FFP depending on a position of the surface emitting laser. Further, the present invention can provide an optical apparatus having the surface emitting laser array capable of suppressing intensity non-uniformity and shape unevenness in a focusing spot on a scanning surface of an optical system having a common aperture stop.

Further features of the present invention will become apparent from the following description of exemplary embodiments with reference to the attached drawings.

BRIEF DESCRIPTION OF THE DRAWINGS

FIG. 2 is a schematic sectional view of a configuration of arranging a plurality of surface emitting lasers according to the embodiment of the present invention.

DESCRIPTION OF THE EMBODIMENTS

Preferred embodiments of the present invention will now be described in detail in accordance with the accompanying drawings.

Figure 1:
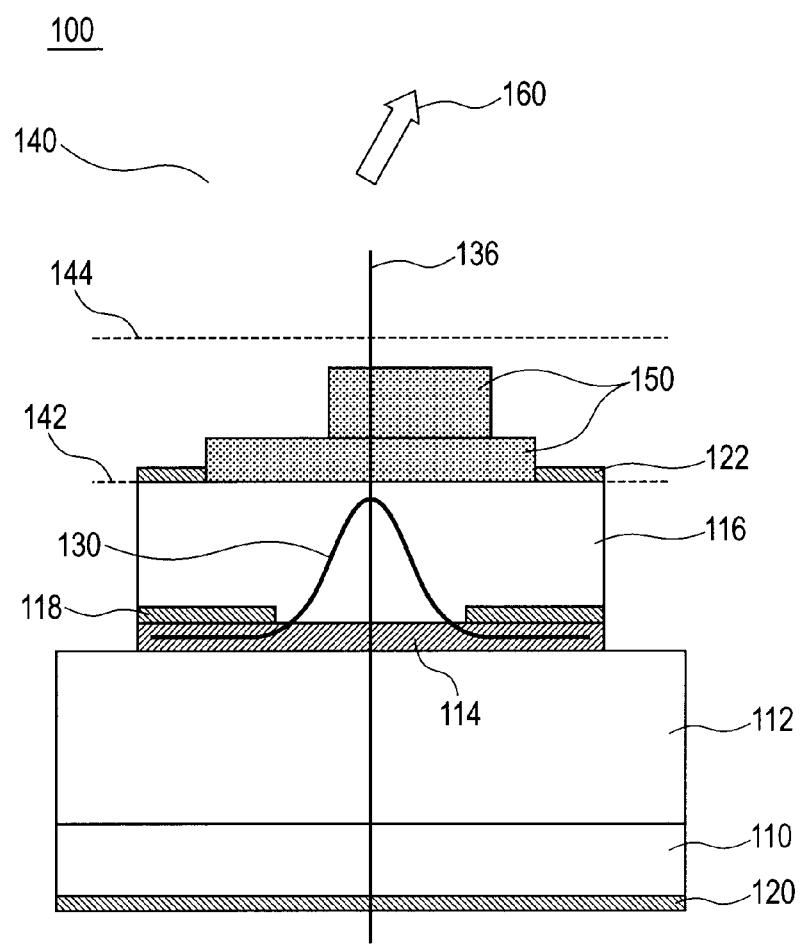
FIG. 1 is a schematic sectional view of a surface emitting laser according to an embodiment of the present invention and a surface relief structure formed on a light emitting surface thereof.

Referring to FIGS. 1 and 2, a surface emitting laser in a surface emitting laser array according to an embodiment of the present invention and a surface relief structure formed on a light emitting surface thereof will be described.

FIG. 1 illustrates a surface emitting laser 100 of the present embodiment including a substrate 110; and a lower mirror (lower reflecting mirror) 112, an active layer 114, and an upper mirror (upper reflecting mirror) 116 which are stacked on the substrate 110 to form a vertical resonator. The active layer 114 and the upper mirror 116 on the substrate are partially etched for device isolation to form a mesa structure. An insulating film may be formed on a side portion and a bottom portion of the etching region (not illustrated in FIG. 1). The upper mirror 116 includes therein a current confinement layer 118 for spatially limiting current flowing through the active layer 114. The current confinement layer 118 defines the light emitting region of the active layer 114. The surface emitting laser 100 oscillates when current is injected through the active layer 114 by a lower electrode 120 on a lower side of the substrate and the upper electrode 122 on an upper side of the upper mirror.

In general, the aforementioned image forming apparatus uses a basic mode 130 having a unimodal intensity distribution as illustrated in FIG. 1 as an oscillation mode of the surface emitting laser so as to form a unimodal latent image on the scanning surface. An electric field amplitude profile in the basic mode 130 inside the resonator can be substantially approximated by a Gaussian function and is symmetrical to a central axis 136 of the light emitting regions of the laser device 100.

A surface relief structure 150 is formed on an upper portion of a light emitting surface 142 as an upper interface of the upper mirror 116. Here, the surface relief structure 150 is configured such that a plurality of regions having a predetermined optical thickness in a normal direction of the substrate is placed in contact with other region in an in-plane direction of the substrate. The surface relief structure 150 according to the embodiment as illustrated in FIG. 1 is configured such that a plurality of regions each having a different optical thickness in the normal direction of the substrate is arranged in the in-plane direction of the substrate. The surface relief structure 150 is made of a material allowing at least some of the laser emitted beams to be transmitted therethrough. Note that the surface relief structure 150 may be made of a plurality of materials.

Here, $d_i(x, y)$ is defined as an optical thickness distribution of the surface relief structure 150 and the environmental medium 140 on a surface emitting laser device i in the normal direction of the substrate. Coordinates (x, y) indicate a position in the in-plane direction of the substrate. The $d_i(x, y)$ indicates an optical thickness distribution in the in-plane direction of the substrate from the light emitting surface 142 of the surface emitting laser device i up to a surface 144 located on an upper portion of the surface relief structure 150 and parallel to the substrate.

The central axis 136 in the light emitting regions of the surface emitting laser device i is defined to be $(x_{i0}, y_{i0})$. The surface relief structure 150 is set so as not to allow $d_i(x, y)$ have a twice rotational symmetry with respect to the central axis 136. More specifically, the surface relief structure 150 is set so that the expression: $d_i(x_{i0}+X, y_{i0}+Y) \neq d_i(x_{i0}-X, y_{i0}-Y)$ is satisfied with respect to a certain (X, Y) (a value equal to or less than the size of the light emitting region in the in-plane direction of the device). At this time, the surface relief structure 150 is made of a material allowing at least some of the laser emitted beams to be transmitted therethrough, and thus a phase difference different for each region is given to an optical electric-field emitted from the light emitting surface.

As described above, the surface relief structure 150 has an asymmetric optical thickness distribution with respect to the central axis of the light emitting regions of the surface emitting laser, causing the electric field of the light emitting regions to have an asymmetric phase difference distribution. As a result, the FFP distribution can be set not to have a twice rotational symmetry with respect to the normal direction of the substrate. In other word, the direction of the FFP centroid can be inclined at more than 0°.

In the present embodiment, surface emitting laser array having a plurality of surface emitting lasers and the plurality of the surface emitting lasers arranged in an array form can be configured as described below.

The aforementioned surface relief structures 150 are provided on some or all of the plurality of the surface emitting lasers. At this time, different shapes of the surface relief structure are used depending on the position of each laser device i in the array to change $d_i(x, y)$. That is, the surface emitting laser array 102 has devices each having a different shape of the surface relief structure 150. More specifically, the surface emitting laser array 102 has devices (a, b) satisfying the expression: $d_a(x_{a0}+X, y_{a0}+Y) \neq d_b(x_{b0}+X, y_{b0}+Y)$ with respect to a certain (X, Y) (a value equal to or less than the size of the light emitting region in the in-plane direction of the device).

The specific shape of the surface relief structure includes the in-plane position of each region, the difference in optical thickness of each region, and the area of each region of the surface relief structure. Thus, the direction 160 of the FFP centroid can be changed depending on the position of the device in the array.

When the surface emitting laser array 102 is applied to an optical system having a common aperture stop, the in-plane direction of a principal ray of each device is set to be the same as the in-plane direction of the direction of the FFP centroid of each device. Further, for example, concerning a laser device located on an opposite side with respect to the center of the laser device array of the array, it is set to allow the surface relief structure to be substantially symmetrical to the center of the array, and the in-plane component of the substrate in the direction of the FFP centroid is set to be reverse. In a case in which the incident pupil is located in front of the device, as illustrated in FIG. 2, the direction 160 of the FFP centroid is preferably inclined toward the center side of the array. In a case in which the incident pupil 170 is located at the back of the device, the direction 160 of the FFP centroid is preferably inclined toward the end portion side of the array.

EXAMPLES

Now, the examples of the present invention will be described.

Example 1

Referring to FIGS. 1 to 5, a configuration example of a surface emitting laser array according to the present invention will be described as example 1.

Figure 3A:
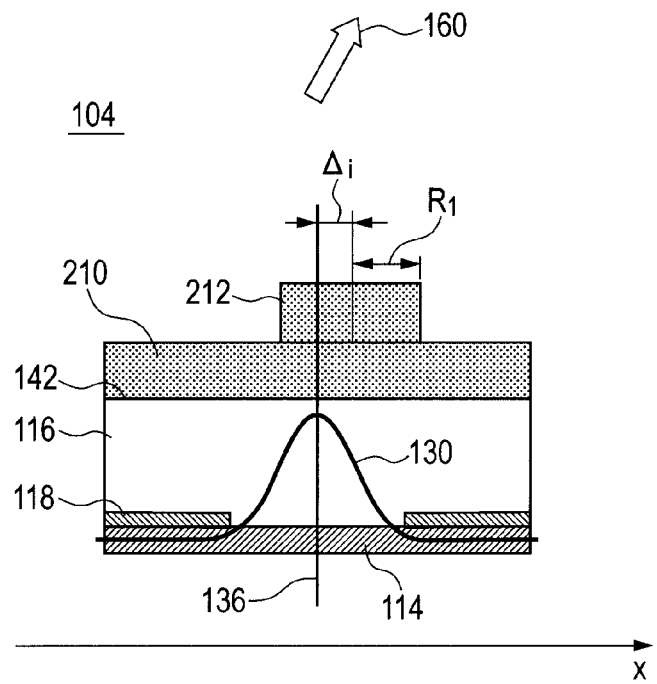
FIG. 3A is a sectional view describing a surface emitting laser constituting a surface emitting laser array according to example 1 of the present invention.
Figure 3B:
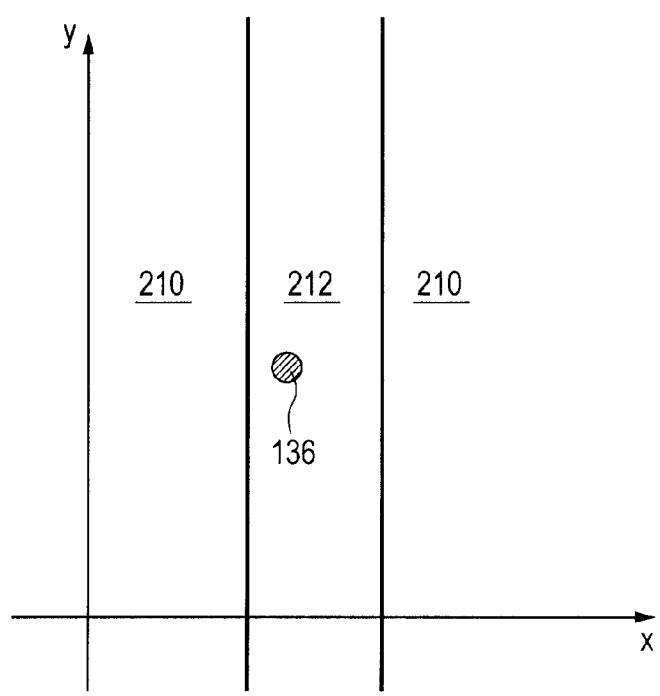
FIG. 3B is an external view seen from above the surface emitting laser constituting the surface emitting laser array according to example 1 of the present invention.

FIG. 3A is a sectional view describing a surface emitting laser 104 constituting a device of a surface emitting laser array of example 1. FIG. 3B is an external view seen from above thereof. The substrate 110, the lower mirror 112, the upper electrode 122, and the lower electrode 120 of the surface emitting laser are the same as those illustrated in FIG. 1 and hence are omitted from FIG. 3A. FIG. 3A is a sectional view of a plane parallel to the x-axis including a central axis 136 of the light emitting regions. FIGS. 5, 6A, 8A, 10A, and 11A (described later) are also a sectional view of a plane parallel to the x-axis including a central axis 136 of the light emitting regions.

As for materials, for example, the substrate 110 is a GaAs substrate; and the lower mirror 112 and the upper mirror 116 are a $\lambda/4$ multilayer reflecting mirror made of $Al_{0.5}Ga_{0.5}As/Al_{0.9}Ga_{0.1}As$. Note that $\lambda$ indicates an oscillation wavelength of the surface emitting laser 104, for example, $\lambda=680$ nm. For example, the lower mirror 112 is composed of 70 pairs of multilayer reflecting mirrors, and the upper mirror 116 is composed of 35 pairs of multilayer reflecting mirrors. The substrate 110 and the lower mirror 112 are n-type doped, and the upper mirror 116 is p-type doped. The active layer 114 is a GaInP/AlGaInP multiple quantum well having a gain at a wavelength of $\lambda$. The upper mirror 116 and the active layer 114 are partially etched to form a cylindrical mesa structure with a radius of 15 µm. The upper electrode 122 made of Ti/Pt/Au is arranged on an upper portion of the upper mirror 116. The lower electrode 120 made of AuGe/Au is arranged on a lower portion of the substrate. The upper electrode 122 has an opening with a radius of 10 µm, from which a laser beam is extracted.

A layer made of $Al_{0.98}Ga_{0.02}As$ is located between the upper mirror 116 and the active layer 114 or inside the upper mirror 116. The layer is oxidized from a side wall of the mesa structure to form a circular current confinement layer 118 with a radius of 2.8 µm as a partially oxidized structure. Oxidized AlGaAs greatly reduces the refractive index, and thus the lateral mode of the surface emitting laser 104 is dominantly determined by the refractive index distribution in an oxidizing/oxidized region.

Note that in order to fabricate the current confinement layer 118 without involving any change in refractive index (for example, by partial insulation such as ion implantation), the lateral mode of the surface emitting laser 104 is determined by a gain distribution of the active layer 114.

The basic mode 130 as a lateral mode having a unimodal intensity distribution is, for example, a Gaussian function with a spot diameter $W=3.5\lambda$. Here, the spot diameter refers to a radius allowing the light intensity to be $1/e^2$ of the central intensity.

The light emitting region is defined as a region where the active layer 114 emits light. The light emitting region is generally larger than the region of the current confinement layer 118. The light emitting region is, for example, a circular region with a radius of 3 W. The central axis 136 of the light emitting regions matches the central axis of the current confinement layer 118.

The coordinates $(x_{i0}, y_{i0})$ indicate the central axis 136 of the light emitting regions of the device i of the surface emitting laser 104.

The surface relief structure 150 is formed on the upper interface 142 of the upper mirror 116 of the surface emitting laser 104. The surface relief structure 150 is a semiconductor or a dielectric made by microfabrication means such as etching and liftoff. The surface relief structure 150 is made of, for example, SiO$_2$ with a refractive index n1 of 1.5. The environmental medium 140 is, for example, air with a refractive index n0 of 1.

The surface relief structure 150 of the present example includes a first relief layer 210 with an optical thickness of D$_1$; and a second relief layer 212 with an optical thickness of D$_2$ located on a partial region of the upper portion thereof. For example, D$_1$=0.5λ, and D$_2$=0.5λ.

Note that the surface relief structure is configured to be different in optical thickness between a plurality of regions and the difference in optical thickness between the plurality of regions is set to an integral multiple of λ/2. This configuration can maintain a constant reflectance of the upper mirror 116 viewed from the active layer 114 due to the structure of the surface relief structure 150.

This configuration can maintain a constant threshold of the surface emitting laser, having the same shape except the surface relief structure 150, regardless of a change in shape of the surface relief structure 150 inside the surface emitting laser array.

Referring to FIGS. 3A and 3B, the second relief layer 212 is smaller, only in size in the x direction, than the first relief layer 210. That is, the surface relief structure 150 of the device i of the surface emitting laser 104 is a mirror symmetric structure with respect to y=y$_{i0}$.

2R$_1$ is defined as the width in the x direction of the second relief layer 212. For example, R$_1$=2.5λ. The center of the second relief layer 212 is shifted by $\Delta_i$ in the x direction from the position of the central axis 136 of the light emitting region.

The optical thickness in-plane distribution d$_i$ (x, y) in the normal direction of the substrate including the surface relief structure 150 and the environmental medium 140 surrounding the surface emitting laser can be expressed in the light emitting region of the device i by the following expression.

$$d_i(x,y) = (\text{constant independent of } x \text{ and } y) + \{D_2 \times n0/n1 \ (x < x_{i0} + \Delta_1 - R_1) D_2 (x_{i0} + \Delta_1 - R_1 \le x \le x_{i0} + \Delta_1 + R_1) D_2 \times n0/n1 (x_{i0} + \Delta_1 + R_1 < x)\}$$

At this time, the region having asymmetry in the x direction and having a large d$_i$ (x, y) is larger on the +x side than on the −x side with respect to the central axis. Thus, the direction 160 of the FFP centroid distribution is inclined in the +x direction.

Since the d$_i$ (x, y) has a y directional symmetry, namely, a mirror symmetry with respect to y=y$_{i0}$, the y directional component of the direction 160 is 0.

Further, the direction of the FFP centroid can be changed in the surface emitting laser array by changing the centroid position of the surface relief structure, namely, here $\Delta_i$, depending on the array position.

Specific examples of calculation are illustrated in FIG. 4. Note that although each surface emitting laser may be different in structure in the surface emitting laser array, here each surface emitting laser has the same structure in the array except the surface relief structure 150.

Here, θx and θy refer to an FFP radiation angle in the x direction and in the y direction respectively.

Figure 4A:
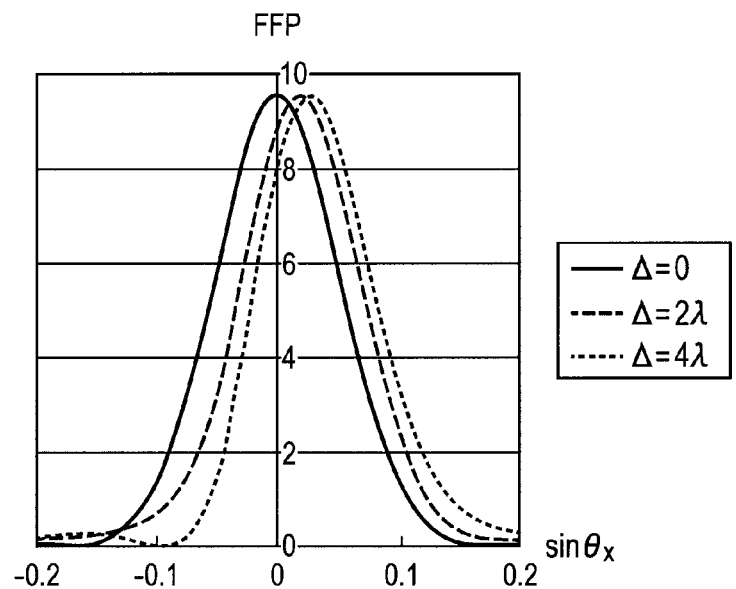
FIG. 4A is a graph illustrating an example of a specific calculation of an FFP according to example 1 of the present invention.

In a case of W=3.5 λ, n0=1, n1=1.5, D$_1$=0.5λ, D$_2$=0.5λ, and R$_1$=4.0λ, the FFP distribution in the θy direction for each A of A$_1$=0, 2.0λ, and 4.0λ is integrated and plotted in FIG. 4A.

Figure 4B:
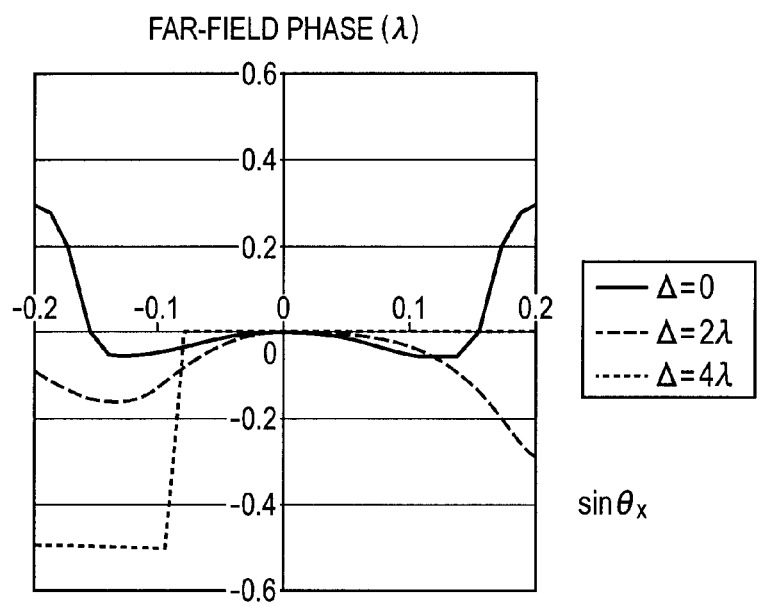
FIG. 4B is a graph illustrating an example of a specific calculation of a far-field phase distribution according to example 1 of the present invention.

The far-field phase distribution (expressed as the difference between the wave front in the far-field and the spherical surface as reference in units of the wavelength X) in a case of θy=0 is plotted in FIG. 4B. In both figures, the horizontal axis is sin θx.

It is understood from FIG. 4A that the direction of the FFP centroid is inclined depending on $\Delta_i$. Specifically, the centroid of the FFP in the x direction is 0°, 0.9°, and 1.8° respectively when $\Delta_i$=0, 2.0 λ, and 4.0λ. Note that here d$_i$ (x, y) depends only on x, but an in-plane rotation of the second relief layer allows d$_i$ (x, y) to be rotated to depend on x and y. In this case, the direction of centroid of the FFP also moves to the aforementioned rotation direction.

Figure 5:
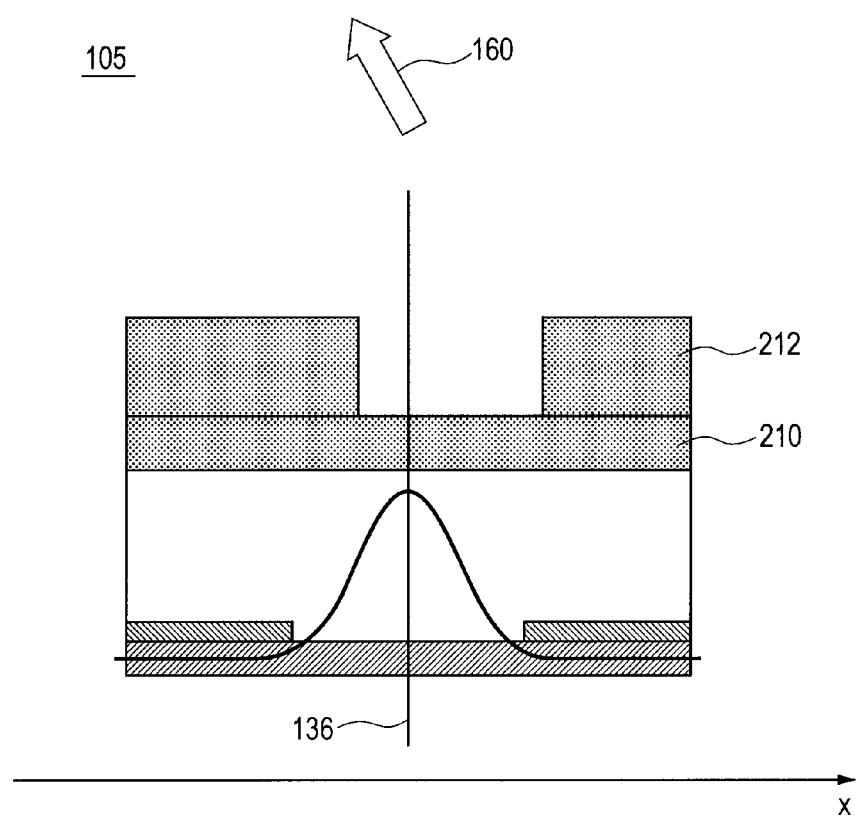
FIG. 5 illustrates a configuration example of a concave surface relief structure according to example 1 of the present invention.

Note that FIG. 3A illustrates a convex surface relief structure as the surface relief structure 150, but a concave surface relief structure may be used as illustrated in FIG. 5.

Example 2

Referring to FIGS. 6A, 6B, 7A, and 7B, a configuration example of a surface emitting laser different from example 1 will be described as example 2.

As illustrated in FIG. 4B, example 1 may have a far-field phase distribution. Here, the presence of the far-field phase distribution indicates that the phase is not constant in a range in which the FFP exists to some extent (for example, half or more of the intensity peak).

Unfortunately, the phase distribution may be unfavorable depending on the degree thereof. For example, when the phase distribution greatly varies, the image forming position on an image forming surface may be shifted or defocus characteristics on the image forming surface may deteriorate.

In order to avoid this problem, the surface relief structure may be configured such that the optical thickness distribution in the in-plane direction of the substrate is set by adding an antisymmetric distribution with respect to the central axis of the light emitting regions of the surface emitting laser and a uniform distribution.

More specifically, the surface relief structure may have d$_i$ (x, y) satisfying (constant independent of x and y)+(antisymmetric distribution with respect to the central axis). Here, the antisymmetric distribution with respect to central axis (x$_{i0}$, y$_{i0}$) refers to f (x, y) satisfying the expression: f (X+X$_{i0}$, Y+y$_{i0}$)=−f (−X+x$_{i0}$, Y+y$_{i0}$) with respect to a certain (X, Y) (a value equal to or less than the size of the light emitting region in the in-plane direction of the device). In the following description, a surface relief structure having d$_i$ (x, y) satisfying (constant independent of x and y)+(antisymmetric distribution with respect to the central axis) is defined as an antisymmetric surface relief structure.

When an antisymmetric surface relief structure is used, the distribution of the far-field phase can be eliminated by causing the direction of the FFP centroid to be inclined from the normal line of the substrate.

Figure 6A:
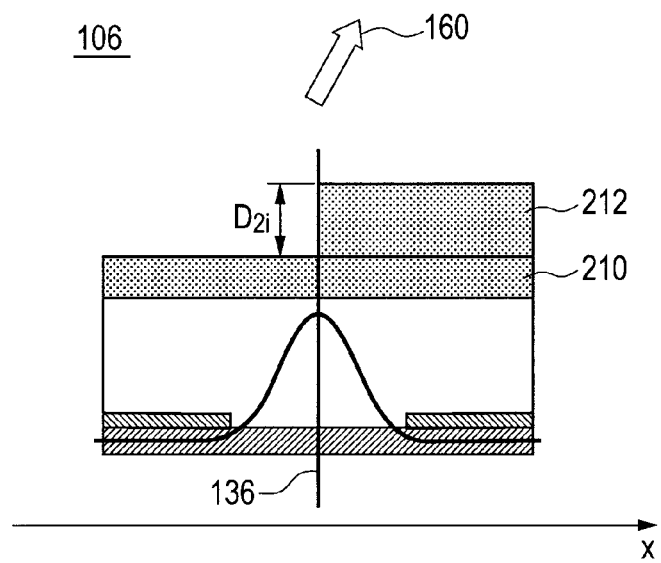
FIG. 6A is a sectional view describing a surface emitting laser constituting a surface emitting laser array according to example 2 of the present invention.
Figure 6B:
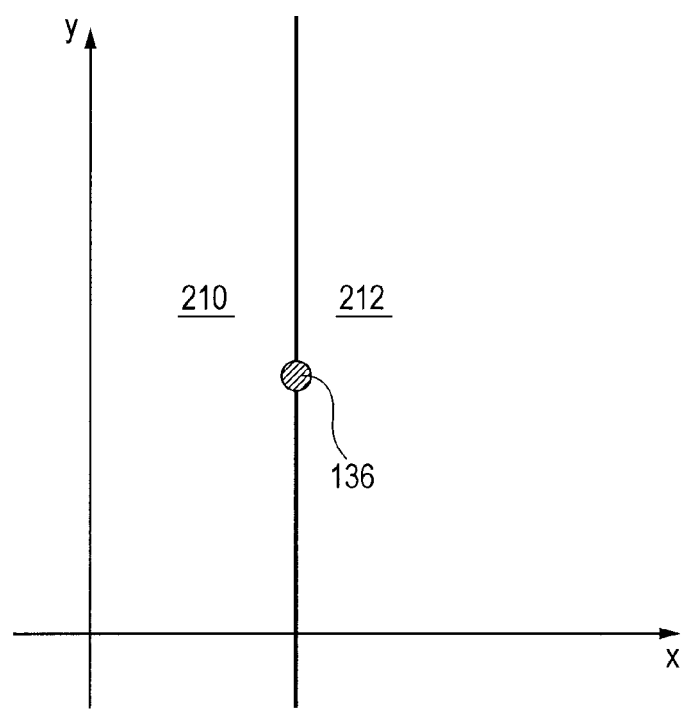
FIG. 6B is an external view seen from above the surface emitting laser constituting the surface emitting laser array according to example 2 of the present invention.

FIGS. 6A and 6B describe a surface emitting laser 106 constituting the surface emitting laser array 102 of the present example. FIG. 6A is a sectional view thereof and FIG. 6B is an external view seen from above.

As illustrated in FIGS. 6A and 6B, the surface relief structure 150 includes a first relief layer 210 with an optical thickness of D$_{1i}$ and a second relief layer 212 with an optical thickness of D$_{2i}$ located on a partial region of the upper portion thereof.

The light emitting regions are divided into two symmetric regions with respect to the central axis by a straight line or a curved line passing through the central axis 136, and the second relief layer is located in one of the regions. For example, at the boundary of x=x$_{i0}$, the light emitting regions are divided into two regions x<x$_{i0}$ and x$_{i0}$<x. When the second relief layer is located in a region x$_{i0}$<x, d$_i$ (x, y) can be expressed in the light emitting region of the device i by the following expression.

$d_i(x,y)$=(constant independent of $x$ and $y$)+{$-D_{2i} \times (n1-n0)/2n1(x<x_{i0})0(x=x_{i0})+D_{2i} \times (n1-n0)/2n1 (x_{i0}<x)$}

The second term of the $d_i$ (x, y) has an antisymmetric distribution with respect to ($x_{i0}$, $y_{i0}$), and hence the distribution of the far-field phase is almost unlikely to occur.

Further, like example 1, a long region is larger on the +x side than on the −x side with respect to the central axis. Thus, the direction 160 of the FFP centroid is inclined in the +x direction. In addition, since the $d_i$ (x, y) has a y directional symmetry, namely, a mirror symmetry with respect to y=$y_{i0}$, the y directional component of the direction 160 is 0.

The direction of the FFP centroid can be changed in the surface emitting laser array by changing the step thickness (optical thickness between a plurality of regions) of the surface relief structure, namely, here $D_{2i}$ depending on the array position. Note that $D_{1i}$ may be appropriately changed between the devices for convenience of fabrication such as aligning the upper interface of the second surface relief layer in the array.

In a case in which $D_{2i} \times (n1-n0)/n1$ is an integral multiple of λ, the phase difference of the beams transmitting through between the two regions is zero, and hence the FFP is almost the same as the case without a surface relief structure.

In a case in which $D_{2i} \times (n1-n0)/n1$ is an odd multiple of λ/2, the phase difference of the beams transmitting through between the two regions is π, but in an antisymmetric surface relief structure, the direction of the FFP centroid matches the normal direction of the substrate due to the symmetry. A larger $D_{2i}$ increases the scattering at an edge portion of the surface relief structure 150. Accordingly, in order to suppress the scattering and exert the effect of inclining the direction of the FFP centroid, $D_{2i} \times (n1-n0)/2n1 < \lambda$ is preferable and $D_{2i} \times (n1-n0)/2n1 < \lambda/2$ is more preferable.

Specific examples of calculation will be described below.

Figure 7A:
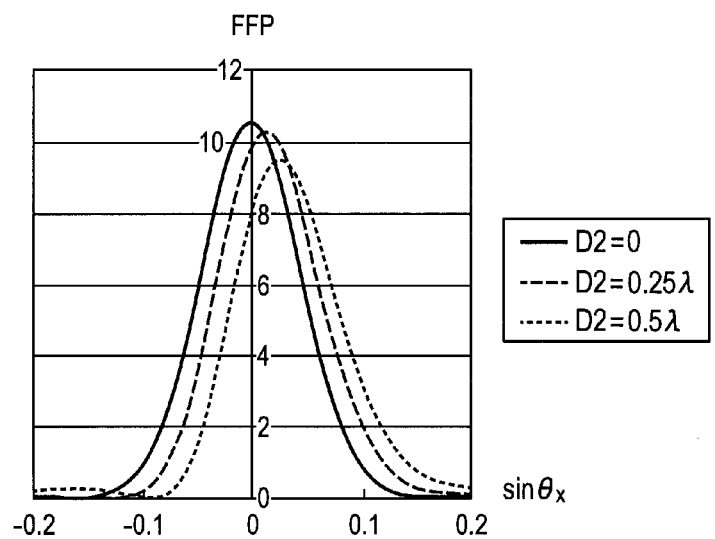
FIG. 7A is a graph illustrating an example of a specific calculation of an FFP according to example 2 of the present invention.
Figure 7B:
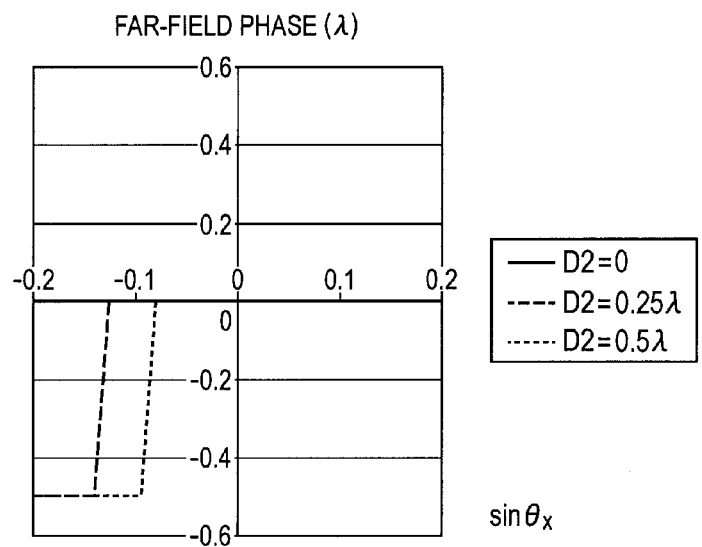
FIG. 7B is a graph illustrating an example of a specific calculation of a far-field phase distribution according to example 2 of the present invention.

In a case of W=3.5λ, n0=1, n1=1.5, and $D_{1i}$=0.5λ, the FFP in the θy direction for each $D_2$=0, 0.25λ, and 0.5λ is integrated and plotted in FIG. 7A. In addition, the far-field phase distribution in a case of θy=0 is plotted in FIG. 7B. In both figures, the horizontal axis is sin θx.

It is understood from FIG. 7A that the direction of FFP centroid is inclined depending on $D_2$. Specifically, the centroid of the FFP in the x direction is 0°, 1.0°, and 1.8° respectively when $D_2$=0, 0.25λ, and 0.5 λ.

Like example 1, an in-plane rotation of the second relief layer allows $d_i$ (x, y) to be rotated to depend on x and y. In this case, the direction of the centroid of the FFP also moves to the aforementioned rotation direction.

Example 3

Referring to FIGS. 8A, 8B, 9A, and 9B, a configuration example in which like example 2, $d_i$ (x, y) of example 3 is antisymmetric and each layer constituting a surface relief structure has a constant optical thickness between the devices will be described. In this case the fabrication process such as etching and liftoff may be done easier in comparison with the case where each layer has a non-constant optical thickness. Further, the optical thickness of each layer is limited to keep a constant reflectance distribution, and hence the design of example 3 may be easier than that of example 2.

Figure 8A:
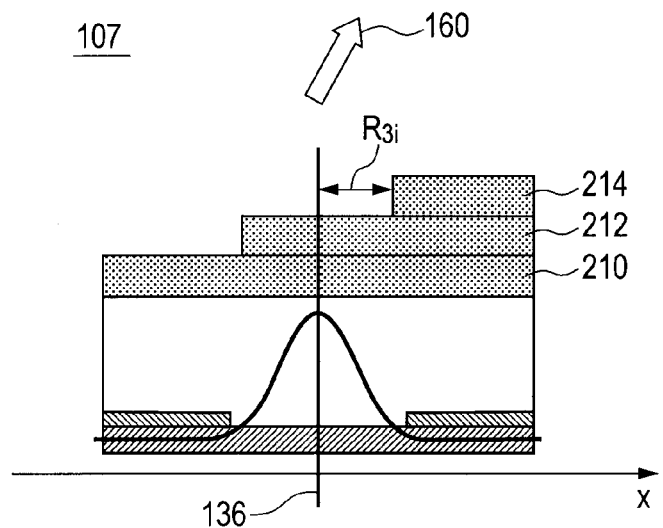
FIG. 8A is a sectional view describing a surface emitting laser constituting a surface emitting laser array according to example 3 of the present invention.
Figure 8B:
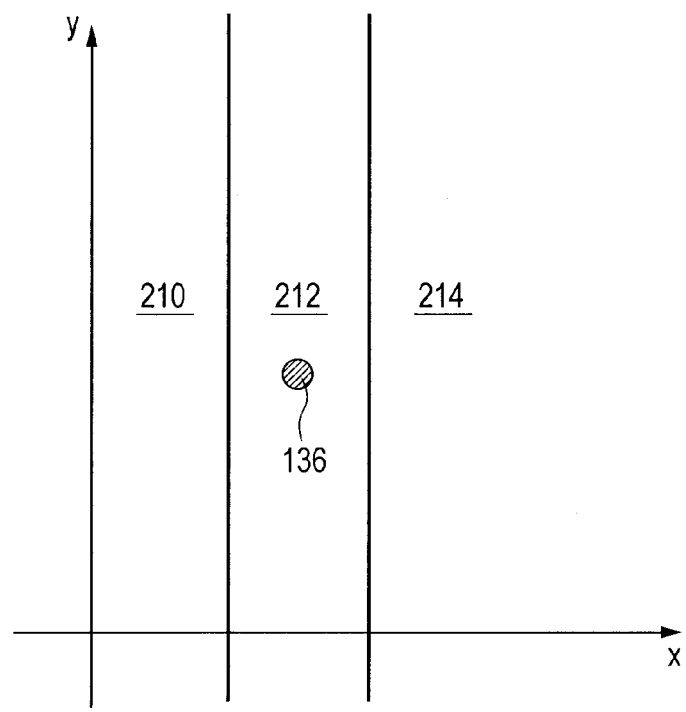
FIG. 8B is an external view seen from above the surface emitting laser constituting the surface emitting laser array according to example 3 of the present invention.

FIG. 8A is a sectional view describing a surface emitting laser 107 constituting the surface emitting laser array 102 of example 3. FIG. 8B is an external view seen from above.

The surface relief structure 150 of the present example includes a first relief layer 210 with an optical thickness of $D_1$; a second relief layer 212 with an optical thickness of $D_2$ located on a partial region of the upper portion thereof; and further a third relief layer 214 with an optical thickness of $D_3=D_2$ located on a partial region of the upper portion thereof.

Note that when $D_2$ is set to an integral multiple of λ/2, it can be configured such that a reflectance distribution due to the structure of the surface relief structure 150 is almost unlikely to occur.

The second relief layer 212 is to be in a region of $x_0-R_{3i}<x$, and the third relief layer 214 is to be in a region of $x_0+R_{3i}<x$. The optical thickness in-plane distribution $d_i$ (x, y) in the normal direction of the substrate including the surface relief structure 150 and the environmental medium 140 surrounding the surface emitting laser can be expressed in the light emitting region of the device i by the following expression.

$d_i(x,y)$=(constant independent of $x$ and $y$)+{$-D_2 \times (n1-n0)/n1(x<x_0-R_{3i})0(x_0-R_{3i} \leq x \leq x_0+R_{3i})+D_2 \times (n1-n0)/n1(x_0+R_{2i}<x)$}

Like example 2, the second term of the $d_i$ (x, y) has an antisymmetric distribution with respect to ($x_{i0}$, $y_{i0}$), and hence the distribution of far-field phase is almost unlikely to occur.

Further, like example 1, a long region is larger on the +x side than on the −x side with respect to the central axis. Thus, the direction 160 of the FFP distribution is inclined in the +x direction. In addition, the y directional component of the direction 160 is 0 because the $d_i$ (x, y) has a y directional symmetry, namely, a mirror symmetry with respect to y=$y_{i0}$.

Note that for the same reason as that for example 2, when $D_2 \times (n1-n0)/n1$ is an integral multiple of λ/2, the direction of the FFP centroid matches the normal direction of the substrate, and hence it is preferable to select $D_2$ so as to be $D_2 \times (n1-n0)/n1 < \lambda/2$.

The direction of the FFP centroid can be changed in the surface emitting laser array by changing the size of a region having the second surface relief layer as the upper most layer, namely, $R_{3i}$ depending on the array position.

Specific examples of calculation will be described below.

Figures 9A, 9B:
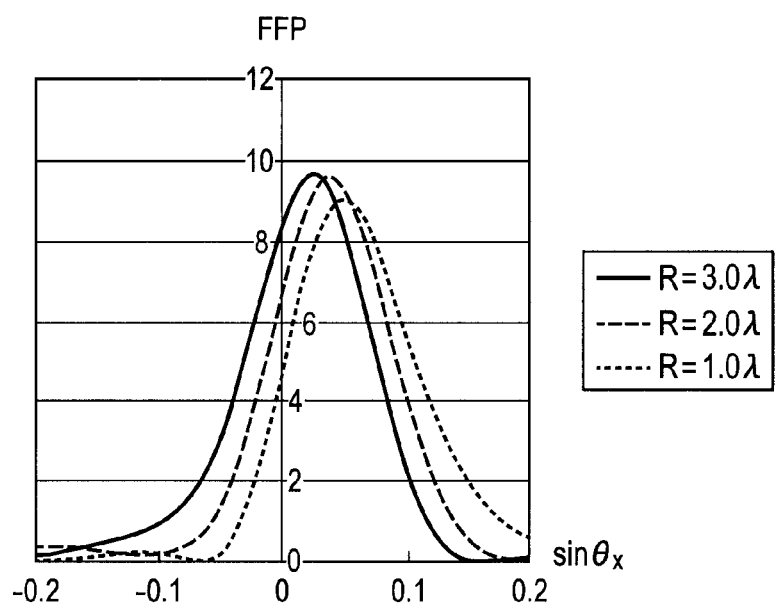
FIG. 9A is a graph illustrating an example of a specific calculation of an FFP according to example 3 of the present invention.
FIG. 9B is a graph illustrating an example of a specific calculation of a far-field phase distribution according to example 3 of the present invention.

In a case of W=3.5λ, n0=1, n1=1.5, and $D_1=D_2=D_3$=0.5λ, the FFP distribution in the θy direction for each $R_{3i}$=3.0 λ, 2.0λ, and 1.0λ is integrated and plotted in FIG. 9A.

In addition, the far-field phase distribution in a case of θy=0 is plotted in FIG. 9B.

In both figures, the horizontal axis is sin θx.

It is understood from FIG. 9A that the direction of FFP centroid is inclined depending on $R_{3i}$. Specifically, the centroid of the FFP in the x direction is 0.8°, 1.8°, and 2.8° respectively when $R_{3i}$=3.0 λ, 2.0 λ, and 1.0 λ.

Like example 1, an in-plane rotation of the second relief layer allows $d_i$ (x, y) to be rotated to depend on x and y. In this case, the direction of the centroid of the FFP also moves to the aforementioned rotation direction.

Figure 10A:
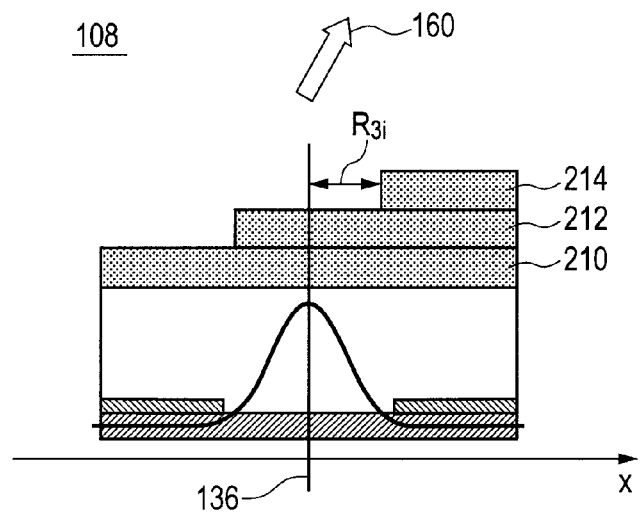
FIG. 10A is a sectional view describing a variation of the surface emitting laser constituting the surface emitting laser array according to example 3 of the present invention.
Figure 10B:
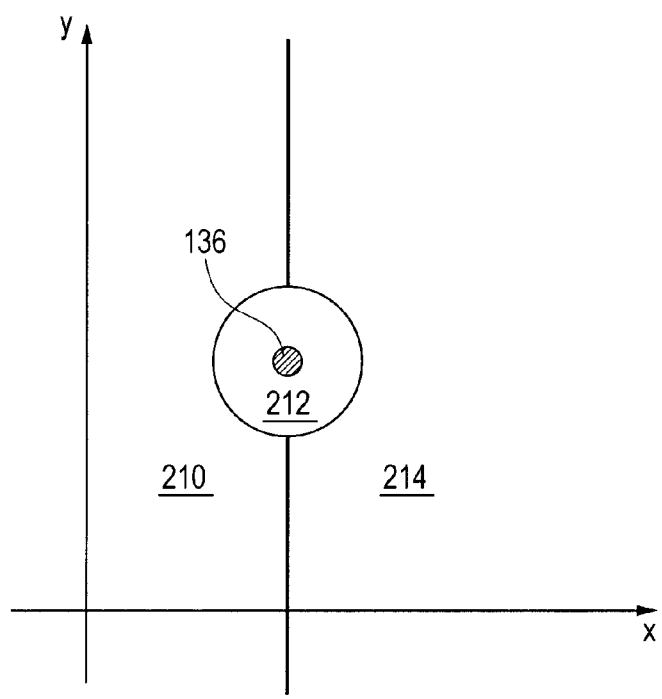
FIG. 10B is an external view seen from above the variation of the surface emitting laser constituting the surface emitting laser array according to example 3 of the present invention.

As variations, the surface relief structure 150 of example 3 can also have a structure as illustrated in FIGS. 10A and 10B.

FIG. 10A is a sectional view describing a variation of the surface emitting laser 108 constituting the surface emitting laser array 102 of example 3. FIG. 10B is an external view seen from above.

In this surface relief structure, $d_i(x,y)$=(constant independent of $x$ and $y$)+{$-D_2 \times (n1-n0)/n1(x<x_0-R_{3i}$ and $x^2+y^2>R_{3i}^2)+D_2 \times (n1-n0)/n1(x_0+R_{3i}<x$ and $x^2+y^2>R_{3i}^2)0(x^2+y^2 \leq R_{3i}^2)$}

Example 4

Figure 11A:
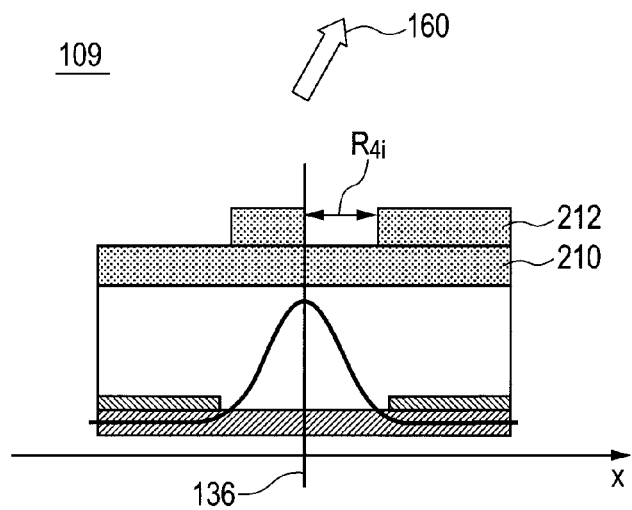
FIG. 11A is a sectional view describing a surface emitting laser constituting a surface emitting laser array according to example 4 of the present invention.
Figure 11B:
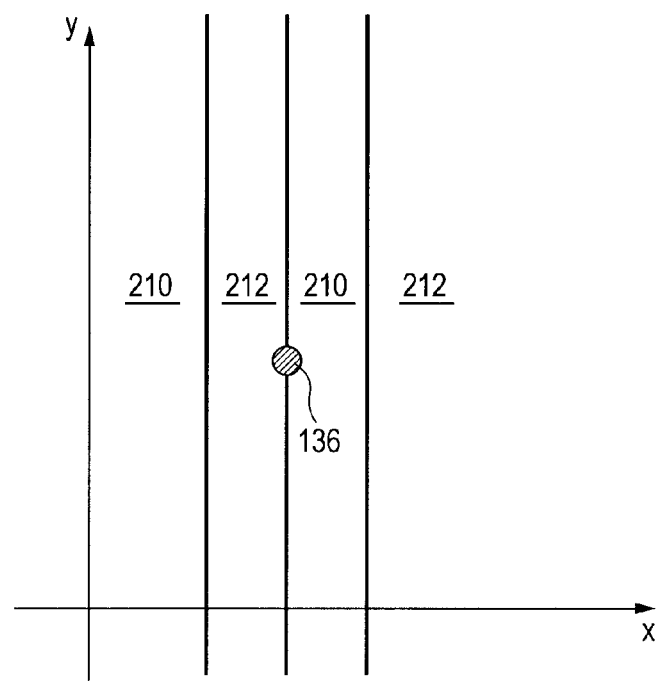
FIG. 11B is an external view seen from above the surface emitting laser constituting the surface emitting laser array according to example 4 of the present invention.

Referring to FIGS. 11A and 11B, a configuration example of a surface emitting laser different from each of the aforementioned examples will be described as example 4.

FIG. 11A is a sectional view describing a surface emitting laser 109 constituting the surface emitting laser array 102 of example 4. FIG. 11B is an external view seen from above.

The surface relief structure 150 of the present example includes a first relief layer 210 with an optical thickness of $D_{1i}$; and a second relief layer 212 with an optical thickness of $D_{2i}$ located on a partial region of the upper portion thereof. The second relief layer 212 is in a region of $x_0 - R_{4i} \leq x < 0$ and $x_0 + R_{4i} \leq x$.

The optical thickness in-plane distribution $d_i(x, y)$ in the normal direction of the substrate including the surface relief structure 150 and the environmental medium 140 surrounding the surface emitting laser can be expressed in the light emitting region of the device i by the following expression.

$$d_i(x,y) = \text{(constant independent of } x \text{ and } y) + \{-D_2 \times (n1-n0)/2n1(x<x_0-R_{4i}) + D_2 \times (n1-n0)/2n1(x_0-R_{4i} \leq x < x_0)0(x=x_0) - D_2 \times (n1-n0)/2n1(x_0 < x \leq x_0+R_{4i}) + D_2 \times (n1-n0)/2n1(x_0+R_{4i} < x)\}$$

Like example 2, the second term of the $d_i(x, y)$ has an antisymmetric distribution with respect to $(x_{i0}, y_{i0})$, and hence the distribution of far-field phase is almost unlikely to occur.

Further, like example 1, a long region is larger on the +x side than on the −x side with respect to the central axis. Thus, the direction 160 of the FFP centroid is inclined in the +x direction. In addition, the y directional component of the direction 160 is 0 because the $d_i(x, y)$ has a y directional symmetry, namely, a mirror symmetry with respect to $y = y_{i0}$.

Further, like example 3, the direction of the FFP centroid can be changed by changing the size of a region having the second surface relief layer as the uppermost layer, namely, $R_{4i}$ depending on the array position.

Since the number of surface relief layers is smaller by one than that of the surface relief structure 150 of example 3, the surface relief structure 150 of example 4 may be easily fabricated.

Hereinbefore, examples 1 to 4 disclose the surface emitting laser array having different shapes of the surface relief structure 150 within the array to be able to incline the direction 160 of the FFP centroid depending on the array position. Examples of shape parameter include the centroid position A, the optical thickness D of a step of the surface relief layer, and the size R of a region of a surface layer, but a plurality of the parameters may be simultaneously changed.

Other parameters may be used within the scope of the present invention. For example, the surface relief may be made of a material having an in-plane refractive index distribution. Further, the material and shape of the surface emitting laser are not limited to the above examples, but other materials and shapes may be used.

Fabrication Method

An example method of fabricating the surface emitting laser array 102 containing a surface emitting laser disclosed in examples 1 to 4 will be described.

For example, the substrate 110 is a 600 μm thick GaAs substrate. Then, the lower mirror 112, the active layer 114, and the upper mirror 116 disclosed in example 1 are grown on the substrate 110 using an MOCVD method or the like. A semiconductor lithography process is used to subject the upper mirror 116 and the active layer 114 to resist patterning and then etching to form a mesa structure. The mesa structures are arranged, for example, at a spacing of 50 μm into an 8×8 orthorhombic lattice to form a mesa structure array. Examples of etching include dry (plasma) etching and wet etching. At dry etching, an upper portion of the region not subjected to etching in the upper mirror 116 may be protected by a dielectric film or other film. The upper mirror 116 or an oxidizable layer interposed between the upper mirror 116 and the active layer 114, such as 30 nm thick $Al_{0.98}Ga_{0.02}As$ is oxidized by heating at 450° C. for 30 minutes in a nitrogen atmosphere containing moisture to form the current confinement layer 118.

Subsequently, an insulating film such as a dielectric film is formed on a side wall and a bottom portion in the etching region and the surface relief structure 150 is formed on the light emitting surface 142 on an upper portion of the upper mirror 116. When a semiconductor is used for the surface relief structure 150, it can be formed by partially etching the upper mirror 116. In this case, the lower interface of the surface relief structure 150 is regarded as the light emitting surface 142. When a dielectric film is deposited to form the surface relief structure 150, an etching method by which a dielectric film is formed so as to have a desired thickness and then is partially removed; and a liftoff method by which a liftoff resist pattern is formed in advance except a region on which a dielectric film is to be formed and after film formation, the liftoff resist pattern is removed, can be used. Further, the above methods may be combined or may be used a plurality of times. The dielectric film is formed, for example, by a plasma CVD method or a sputtering method. Furthermore, the surface relief structure 150 and the mesa structure may be simultaneously patterned by a self-aligned process.

The upper electrode 122 is formed on an upper portion of the upper mirror 116, and the lower electrode 120 is formed on a lower portion of the substrate 110. The electrode is, for example, a metal electrode disclosed in example 1 and is formed by electron beam deposition or resistance heating deposition. The upper electrode 122 has an opening formed by a liftoff method.

The order of forming the surface relief structure 150, the upper electrode 122, and the lower electrode 120 may be changed.

Example 5

Figure 12:
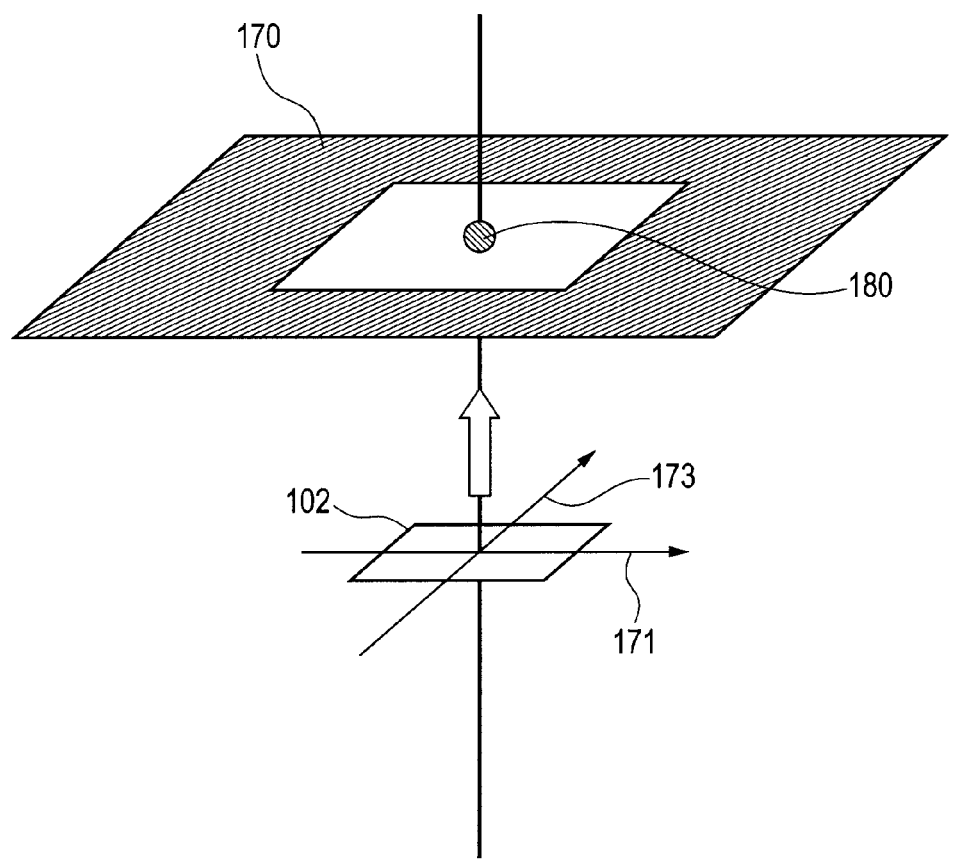
FIG. 12 describes a surface emitting laser array and an incident pupil of an optical system of an image forming apparatus according to example 5 of the present invention in a case in which the incident pupil is located on the light emitting side of the surface emitting laser array.
Figure 13:
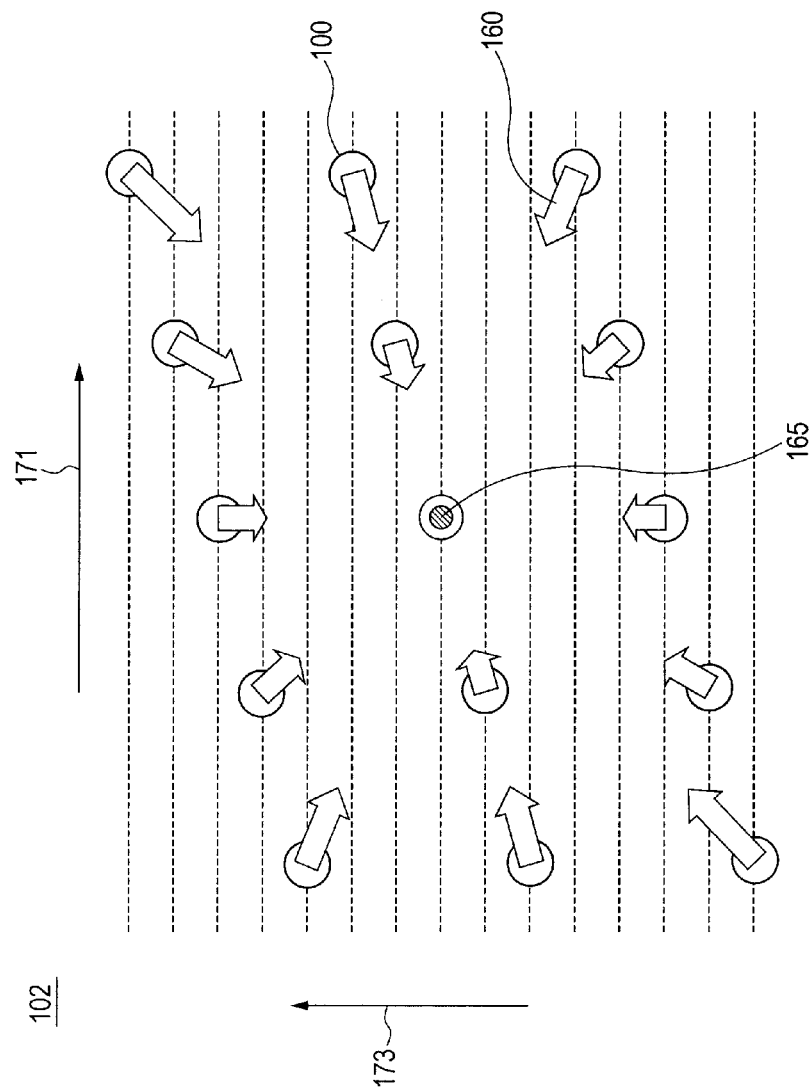
FIG. 13 is a schematic external view seen from above (light emitting side of) the surface emitting laser array according to example 5 of the present invention.

Referring to FIGS. 12 and 13, an example of a surface emitting laser array and an incident pupil 170 in a case in which the incident pupil is located on the light emitting side of the surface emitting laser array in the optical system of the image forming apparatus will be described as example 5.

FIG. 12 illustrates the surface emitting laser array and the incident pupil in a case in which an incident pupil 170 is located on the light emitting side of the surface emitting laser array. FIG. 13 is a schematic external view seen from above (the light emitting side of) the surface emitting laser array. The direction 171 is a main scanning direction of the image forming apparatus. The direction 173 orthogonal to the direction 171 is a sub-scanning direction.

The surface emitting laser array 102 includes surface emitting lasers arranged in an orthorhombic lattice. In particular, one surface emitting laser is provided on and for each reference line equally spaced in the sub-scanning direction (indicated by dotted lines in FIG. 13).

The center of the array is located on the optical axis of the optical system having the center of the incident pupil.

The surface emitting laser array 102 has a surface emitting laser disclosed in any one of the examples 1 to 4. The direction 160 of the FFP centroid of the surface emitting laser is inclined from the normal line of the substrate. In FIG. 13, the direction 160 of the FFP centroid is parallel to the substrate. FIG. 13 illustrates an optical axis 165 of the optical system of the image forming apparatus.

Here, the projected component of the direction of the FFP centroid on the substrate is oriented to the same direction or the opposite direction with respect to a direction connecting each surface emitting laser arranged in an array form to a predetermined point in the array of the surface emitting lasers arranged in the array form. For example, in a case in which the incident pupil is located on the light emitting side of the light source, the surface relief structure is designed such that the projected component on the substrate is oriented to the center of the array. Conversely, in a case in which the incident pupil is located on the opposite side of the light emitting side of the light source, the surface relief structure is designed such that the component is oriented in the opposite direction to the center of the array. As a result, a lot of emitted light from laser can be led to the inside of a pupil.

Further, the surface relief structure is designed such that the direction of the FFP centroid from each surface emitting laser meets at a certain point on the optical axis. Thus, the surface emitting laser array and the optical system are arranged such that the point matches the center point 180 of the incident pupil 170 and the line connecting the surface emitting laser to the direction of the FFP centroid matches the principal ray.

The optical system of the image forming apparatus may use an anamorphic optical system different in magnification between the main scanning direction and the sub-scanning direction, and an aperture stop may be located in a different position between the main scanning direction and the sub-scanning direction. In this case, the incident pupil may be located in a different position between the main scanning direction and the sub-scanning direction. For example, in a case in which a pupil in the sub-scanning direction is located in an emitting-side of a surface emitting laser and a pupil in the main scanning direction is located in the opposite side of the emitting-side, regarding a first line and a second line which are orthogonal to each other and are parallel to the substrate, for each of the lasers, a component of the direction of FFP centroid which is parallel to the first line is oriented to a opposite side of a center of the arrangement, a component of the direction of FFP centroid which is parallel to the second line is oriented to the center of the arrangement.

The direction 160 of the FFP centroid of the surface emitting lasers is inclined from the normal line of the substrate. The line connecting the surface emitting laser to the direction of the FFP centroid is designed to pass through the two lines which are parallel to the substrate, located outside the surface emitting laser array, and in a mutually skew position. Then, the surface emitting laser array and the optical system are arranged such that the two lines match the centerline 181 of the incident pupil in the main scanning direction (a first line direction) and the centerline 182 of the incident pupil in the sub-scanning direction (a second line direction) and the line connecting the surface emitting laser to the direction of the FFP centroid matches the principal ray.

Figure 14:
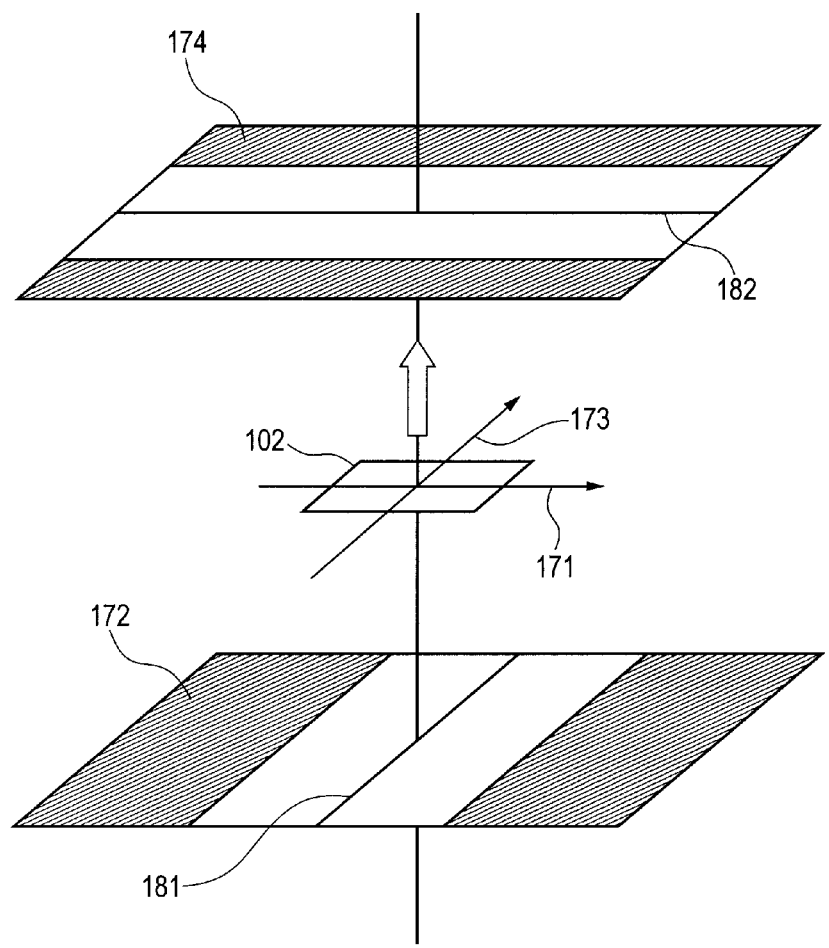
FIG. 14 describes the surface emitting laser array and the incident pupil according to example 5 of the present invention in a case in which the incident pupil in a sub-scanning direction is located on the light emitting side of the surface emitting laser array and the incident pupil in a main scanning direction is located on a side opposite to the light emitting side thereof.
Figure 15:
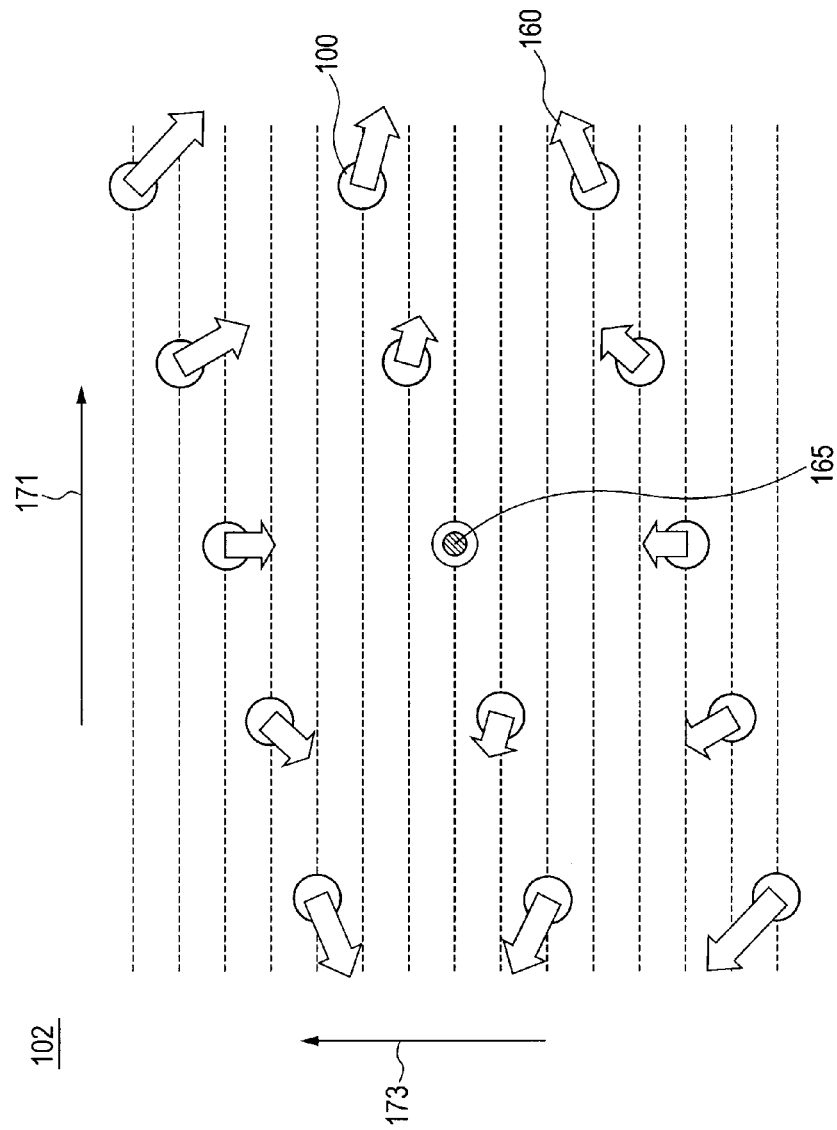
FIG. 15 is a schematic external view seen from above (light emitting side of) the surface emitting laser array according to example 5 of the present invention.

For example, FIG. 14 illustrates the surface emitting laser array and the incident pupil in a case in which an incident pupil 174 in a sub-scanning direction is located on the light emitting side of the surface emitting laser array and an incident pupil 172 in a main scanning direction is located on a side opposite to the light emitting side thereof. FIG. 15 is a schematic external view seen from above (light emitting side of) the surface emitting laser array. This arrangement may be applied to a case in which an aperture stop in the sub-scanning direction is located between the light source and a collimator lens and an aperture stop in the main scanning direction is located between the collimator lens and a scanning optical system.

The laser device layout of the surface emitting laser array 102 in FIG. 15 is the same as that in FIG. 13, but is different in surface relief structure. Specifically, the incident pupil in the sub-scanning direction is located on the light emitting side of the surface emitting laser array and the incident pupil in the main scanning direction is located on a side opposite to the light emitting side thereof. Each surface relief structure is configured such that in the main scanning direction, the in-plane component in the direction 160 of the FFP is oriented in a direction opposite to the center of the array; and in the sub-scanning direction, the in-plane component is oriented to the center of the array.

The degrees of inclination in the direction of the FFP centroid can be determined according to the distance between each light source and pupil, and the F number of the optical system. It is preferable that the farther away the surface emitting laser is from the optical axis, the more the direction 160 of the FFP centroid is inclined from the normal line of the substrate. For example, in a case in which the F number on the incident side is 30, the distance from the light source to the incident pupil is 12 mm, and the distance from the optical system optical axis to the surface emitting laser is 0.5 mm, the direction viewed from the surface emitting laser to the incident pupil is inclined by 2.4° with respect to the normal line of the substrate.

Likewise, the direction at the pupil end of the incident pupil is inclined in a range of 1.4° to 3.3° with respect to the normal line of the substrate. In this case, it is preferable to determine the shape of the surface relief structure such that the direction of the FFP centroid of the surface emitting lasers falls within a range of 1.4° to 3.3°.

In particular, it is preferable that the direction of the FFP centroid is 2.4°.

As the shape of the surface relief structure, for example, the shapes illustrated in examples 1 to 4 can be selected or other shapes in the range of the present invention can be selected.

Example 6

Figure 16A:
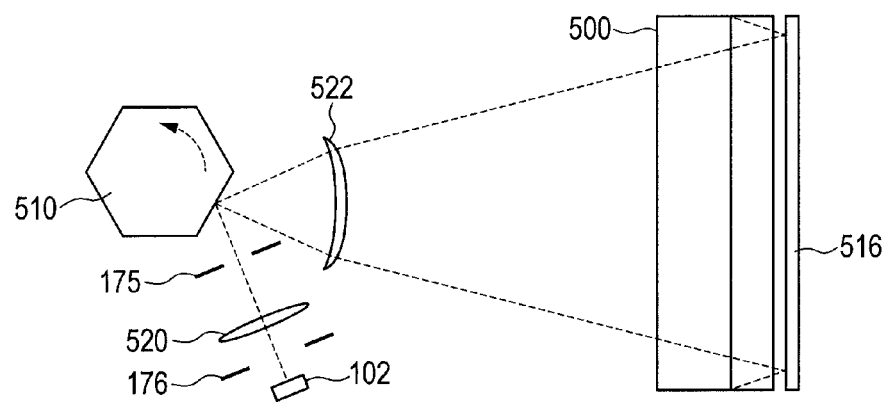
FIG. 16A is a plan view of an image forming apparatus using an electrophotographic recording system having the surface emitting laser array according to example 5 of the present invention.
Figure 16B:
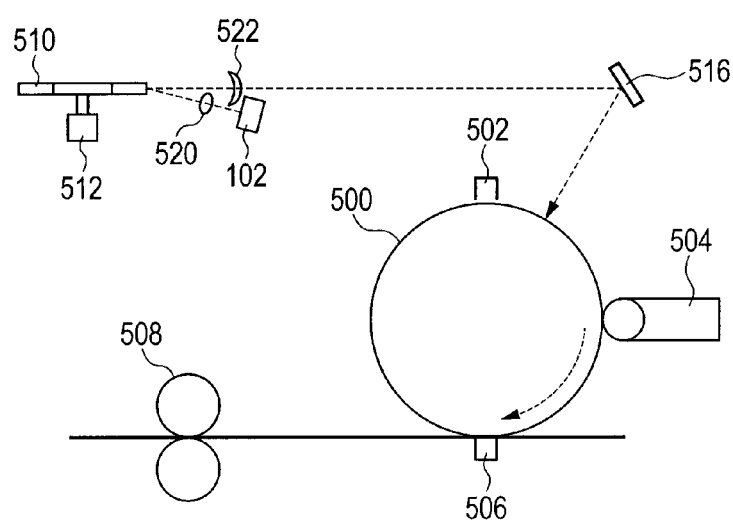
FIG. 16B is a side view of the image forming apparatus using an electrophotographic recording system having the surface emitting laser array according to example 5 of the present invention.

Referring to FIGS. 16A and 16B, an example of configuring an image forming apparatus as an application example using a surface emitting laser array light source configured by arranging a plurality of surface emitting lasers according to examples 1 to 4 and an optical apparatus will be described as example 6.

FIG. 16A is a plan view of an image forming apparatus using an electrophotographic recording system having the surface emitting laser array 102 according to the present invention. FIG. 16B is a side view of the image forming apparatus. FIGS. 16A and 16B illustrate a photoreceptor drum 500, a charging device 502, a developing device 504, a transfer charging device 506, a fixing device 508, a rotating polygon mirror 510, and a motor 512. Further, FIGS. 16A and 16B illustrate a surface emitting laser array light source 102, a reflecting mirror 516, a collimator lens 520, and an f-θ lens 522.

In FIGS. 16A and 16B, the motor 512 rotates and drives the rotating polygon mirror 510. The rotating polygon mirror 510 according to the present example has six reflection surfaces. The surface emitting laser array 102 serves as a recording light source and is configured to be turned on and off according to an image signal by a driver (not illustrated). The optically modulated laser beam is emitted from the surface emitting laser array 102 toward the rotating polygon mirror 510 through the collimator lens 520. Here, the aperture stop 175 in the main scanning direction is interposed between the collimator lens 520 and the rotating polygon mirror 510, and the aperture stop 176 in the sub-scanning direction is interposed between the surface emitting laser array 102 and the collimator lens 520 (omitted in FIG. 16B). Note that the lens itself having a finite diameter may serve as the aperture stop.

The rotating polygon mirror 510 rotates in a direction indicated by the arrow. A laser beam output from the surface emitting laser array 102 is reflected as a deflected beam continuously changing the emission angle on the reflection surface with rotation of the rotating polygon mirror 510. The reflected light is subjected to distortion correction by the f-θ lens 522, passing through the reflecting mirror 516, and reaches the photoreceptor drum 500. Then, the reflected light is scanned in the main scanning direction on the photoreceptor drum 500. At this time, the beam reflected on one surface of the rotating polygon mirror 510 is scanned in the main scanning direction of the photoreceptor drum 500 to form an image of a plurality of lines corresponding to the surface emitting laser array 102.

According to the present example, a 16×4 surface emitting laser array 102 is used to form a 64-line image. The photoreceptor drum 500 is preliminarily charged by the charging device 502. The laser beam is scanned and exposed in sequence to form an electrostatic latent image. The photoreceptor drum 500 rotates in a direction indicated by the arrow, and the formed electrostatic latent image is developed by the developing device 504. The developed visible image is transferred to a transfer sheet (not illustrated) by the transfer charging device 506. The transfer sheet with the visible image transferred thereon is conveyed to the fixing device 508. The fixed sheet is discharged outside the apparatus.

A beam detect sensor (BD sensor) (not illustrated) is arranged near a scan start position in the main scanning direction in a side portion of the photoreceptor drum 500. The laser beam reflected on each reflection surface of the rotating polygon mirror 510 is detected by the BD sensor before line scanning.

The detected signal is input to a timing controller (not illustrated) as the scan start reference signal in the main scanning direction. Based on the signal, the write start position in the scanning direction in each line is synchronized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-233276, filed Oct. 18, 2010, which is hereby incorporated by reference herein in its entirety.

What is claimed is:

1. A surface emitting laser array having a substrate and a plurality of surface emitting lasers, wherein
some or all of said plurality of surface emitting lasers comprise a lower DBR minor, an active layer, an upper DBR minor and a surface relief structure stacked in this order on said substrate, said surface relief structure has a plurality of regions having predetermined optical thicknesses in a normal direction normal to said substrate, a distribution of said optical thicknesses in an in-plane direction of said substrate comprises an asymmetric distribution with respect to a central axis of a light-emitting region of said surface emitting laser,
said surface relief structure has a first relief layer arranged on said upper DBR minor and a second relief layer arranged on a partial region of the first relief layer, and
said distribution of said optical thicknesses of the surface relief structure in said some or all of said plurality of surface emitting lasers is configured such that lines respectively extending a direction of a centroid of respective far-field patterns (FFP) of each of said surface emitting lasers meet at a predetermined point, and
wherein coordinates (x, y) indicate a position in said in-plane direction of said substrate, and the surface relief structure optical thickness di (x, y) is expressed in a light emitting region of the device i by the following expression:

$$d_i(x,y) = (\text{constant independent of } x \text{ and } y) + Q$$

where Q=

$D_2 \times n0/n1$ (if $x < x_{i0} + \Delta_1 - R_1$)

$D_2$ (if $x_{i0} + \Delta_1 - R_1 \leq x \leq x_{i0} + \Delta_1 + R_1$)

$D_2 \times n0/n1$ (if $x_{i0} + \Delta_1 + R_1 < x$)

where $D_2$ is an optical thickness of said second relief layer, n0 is a refractive index of environmental medium, n1 is a refractive index of said second relief layer, $x_{i0}$ is an x coordinate of a central axis in said light emitting region of said surface emitting laser device i, $\Delta_1$ is a distance in the x direction between a center of said second relief layer of said surface emitting laser device i and said central axis in said light emitting region of said surface emitting laser device i, and $R_1$ is half a width in the x direction of said second relief layer of said surface emitting laser device i.

2. The surface emitting laser array according to claim 1, wherein said surface emitting lasers are configured to have different configurations in positions of said plurality of regions in said in-plane direction of said substrate.

3. The surface emitting laser array according to claim 1, wherein said surface emitting lasers are configured to have different configurations in said optical thicknesses of said plurality of regions.

4. The surface emitting laser array according to claim 1, wherein said surface emitting lasers are configured to have different configurations in sizes of said plurality of regions.

5. The surface emitting laser array according to claim 1, wherein, for some of said surface emitting lasers, a projected component of a direction of the FFP centroid on said substrate is oriented to one of a same direction and an opposite direction with respect to a direction connecting each surface emitting laser, arranged in an array, to a predetermined point in the array of said surface emitting lasers arranged in said array.

6. The surface emitting laser array according to claim 1, wherein, for some of the surface emitting lasers, a projected component of a direction of the FFP centroid on the substrate surface is oriented to an opposite direction of a direction connecting each of said lasers to the center of said array.

7. The surface emitting laser array according to claim 1, wherein, for each of said surface emitting lasers, a line extending a direction of the FFP centroid is configured to meet at a predetermined point on the central axis of the light-emitting region of one of said surface emitting lasers.

8. The surface emitting laser array according to claim 1, wherein regarding a first line and a second line which are orthogonal to each other and are parallel to said substrate, for some of said surface emitting lasers, a component of a direction of the FFP centroid which is parallel to said first line is oriented to an opposite side of a center of an arrangement of said surface emitting lasers, and a component of a direction of the FFP centroid which is parallel to said second line is oriented to the center of said arrangement.

9. An optical apparatus comprising:
said surface emitting laser array according to claim 1; and
an optical system extracting beams emitted from surface emitting lasers constituting said surface emitting laser array through a common aperture stop.

10. The optical apparatus according to claim 9, wherein, for each of said lasers, a projected component of a principal ray from said surface emitting laser in said optical system on the plane of said substrate has the same direction as a projected component of a direction of the FFP centroid on said substrate.

11. The surface emitting laser array according to claim 1, wherein, when coordinates (x, y) indicate a position in the in-plane direction of said substrate, a distribution of said optical thicknesses in said in-plane direction of said substrate has asymmetry in an x direction and has symmetry in a y direction.

12. The surface emitting laser array according to claim 1, wherein said surface emitting laser has a current confinement layer, and wherein the central axis of said light-emitting region is configured to match the central axis of said current confinement layer provided in said surface emitting laser.

13. The optical apparatus according to claim 9, wherein said predetermined point is placed in an aperture of the common aperture stop.

* * * * *